(12) United States Patent   (10) Patent No.: US 7,477,082 B2
Fukazawa                    (45) Date of Patent:    Jan. 13, 2009

(54) METHOD AND CIRCUIT FOR DRIVING H-BRIDGE THAT REDUCES SWITCHING NOISE

(75) Inventor: Hidetaka Fukazawa, Kurokawa-gun (JP)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/749,147

(22) Filed: May 15, 2007

(65) Prior Publication Data

US 2008/0284209 A1    Nov. 20, 2008

(51) Int. Cl.
*H03B 1/00*   (2006.01)
*H03K 3/00*   (2006.01)

(52) U.S. Cl. .................. 327/108; 327/110; 326/82; 326/83; 326/87

(58) Field of Classification Search ......... 327/108–112, 327/379, 389, 391; 326/22–27, 82, 83, 86, 326/87
See application file for complete search history.

(56) References Cited

U.S. PATENT DOCUMENTS 5,736,973 A    4/1998   Godfrey et al.
5,990,640 A    11/1999  Dwyer et al.
6,333,617 B1*  12/2001  Itabashi et al. .............. 318/801
6,900,657 B2   5/2005   Bui et al.
2006/0176007 A1* 8/2006 Best ........................ 318/685

FOREIGN PATENT DOCUMENTS

JP    2000082946 A    3/2000

* cited by examiner

*Primary Examiner*—Long Nguyen
*Assistant Examiner*—Brandon S Cole
(74) *Attorney, Agent, or Firm*—Charles Bergere

(57) ABSTRACT

An H-bridge drive circuit for reducing switching noises while preventing shoot-through current from flowing in the H-bridge circuit. The H-bridge drive circuit includes an H-bridge circuit for driving a load with a first power supply and a lower voltage second power supply. The H-bridge circuit includes first to fourth transistors. The first and third transistors are connected to the first power supply. The second transistor is connected between the first transistor and the second power supply, and the fourth transistor is connected between the third transistor and the second power supply. The load is connected to a node between the first and the second transistors and a node between the third and the fourth transistors. A control circuit switches the activation and inactivation of the first to fourth transistors so as to maintain at least either one of the second and fourth transistor in an activated state.

5 Claims, 3 Drawing Sheets

METHOD AND CIRCUIT FOR DRIVING H-BRIDGE THAT REDUCES SWITCHING NOISE

BACKGROUND OF THE INVENTION

The present invention relates to an H-bridge drive circuit, and more specifically, to a method and circuit for controlling the drive of transistors in an H-bridge circuit.

In the prior art, an H-bridge circuit is incorporated, for example, in a motor driver for driving a motor (load) or a switching regulator for supplying power to an internal circuit (load) of an LSI. The H-bridge circuit is also referred to as a full-bridge circuit and normally includes four transistors. Japanese Laid-Open Patent Publication No. 2000-82946 describes an H-bridge circuit having a different configuration. This H-bridge circuit includes six transistors.

FIG. 1 is a schematic circuit diagram of a prior art H-bridge circuit 100 using four transistors The H-bridge circuit 100 includes four transistors T1, T2, T3, and T4. The transistors T1 to T4 are each formed by an N-channel MOS transistor and connected between a first power supply VM (e.g., 5V power supply) and a second power supply PGND (e.g., ground (0V)).

The first transistor T1 has a drain connected to the first power supply VM, a source connected to a first output terminal 102, and a gate receiving a first drive voltage topA. The second transistor T2 has a drain connected to the first output terminal 102, a source connected to the second power supply PGND, and a gate receiving a second drive voltage botA. Accordingly, the first and second transistors T1 and T2 are connected in series between the first and the second power supplies VM and PGND, and the first output terminal 102 is connected between the first and the second transistors T1 and T2.

The third transistor T3 has a drain connected to the first power supply VM, a source connected to a second output terminal 104, and a gate receiving a third drive voltage topB. The fourth transistor T4 has a drain connected to the second output terminal 104, a source connected to the second power supply PGND, and a gate receiving a fourth drive voltage botB. Accordingly, the third and fourth transistors T3 and T4 are connected in series between the first and the second power supplies VM and PGND, and the second output terminal 104 is connected between the third and the fourth transistors T3 and T4.

A motor 110 serving as a load is connected to the first output terminal 102, which is located between the first and the second transistors T1 and T2, and the second output terminal 104, which is located between the third and the fourth transistors T3 and T4. The H-bridge circuit 100 of FIG. 1 is used as a motor driver for driving the motor 110.

The first to fourth transistors T1 to T4 are driven by the first to fourth drive voltages topA, botA, topB, and botB, which are generated by a control circuit (not shown). The first and fourth transistors T1 and T4 define a first set, and the second and third transistors T2 and T3 define a second set. The control circuit generates the drive voltages topA, botA, topB and botB so that the first set of the transistors T1 and T4 and the second set of the transistors T2 and T3 are activated and inactivated in a complementary manner.

When the first and fourth transistors T1 and T4 are activated by drive voltages topA and botB having an H level, the second and third transistors T2 and T3 are inactivated by drive voltages botA and topB having an L level. In this state, a first current path is formed extending through the first transistor T1, the motor 110 (load), and the fourth transistor T4 between the first and the second power supplies VM and PGND. Accordingly, a first output voltage OUTA applied to the first output terminal 102 causes the motor 110 to generate rotation in a first direction (e.g., forward direction).

When the second and third transistors T2 and T3 are activated by the drive voltages botA and topB having an H level, the first and fourth transistors T1 and T4 are inactivated by the drive voltages topA and botB having an L level. In this state, a second current path is formed extending through the third transistor T3, the motor 110 (load), and the second transistor T2 between the first and the second power supplies VM and PGND. Accordingly, a second output voltage OUTB applied to the second output terminal 104 causes the motor 110 to generate rotation in a second direction (e.g., reverse direction), which is opposite the first direction.

In this manner, the H-bridge circuit 100 changes the direction of the voltage to be applied to the motor 110 by a single power supply (first power supply VM) and controls the drive of the motor 110.

FIG. 2 is a timing diagram showing a drive sequence for controlling the H-bridge circuit 100 of FIG. 1. The drive sequence of the prior art includes a first driving step for driving the motor 110 with the first current path, a second driving step for driving the motor 110 with the second current path, and a switching step for switching between the first and the second current paths.

In the first driving step, the first and fourth drive voltages topA and botB rise to an H level to activate the first and fourth transistors T1 and T4. As a result, the first output voltage OUTA (approximately 5V) is applied to the first output terminal 102, and the motor 110 is driven in the first rotating direction.

In the second driving step, the second and third drive voltages botA and topB rise to an H level to activate the second and third transistors T2 and T3. As a result, the second output voltage OUTB (approximately 5V) is applied to the second output terminal 104, and the motor 110 is driven in the second rotating direction.

In the switching step, the first to fourth drive voltages topA, botA, topB, and botB are set to an L level, and the first to fourth transistors T1 to T4 are all inactivated. The switching step switches the first to fourth transistors T1 to T4 to prevent shoot-through current from flowing through the transistors T1 and T2 or shoot-through current from flowing through the transistors T3 and T4. Such a switching step is also referred to as an OFF-OFF period or dead time.

However, switching noises such as undershoots A1 and A2 or an overshoot B1 are produced in the switching step (OFF-OFF period) of the prior art sequence shown in FIG. 2. The undershoots A1 and A2 are caused by back electromotive force (BEMF) of the motor 110. For example, even when the first and fourth drive voltages topA and botB fall to an L level from an H level and inactivate each of the transistors T1 to T4, the motor 110 continues the flow of current from the first output terminal 102 to the second output terminal 104. Accordingly, current supplied from the second power supply PGND through a parasitic diode between the source and drain of the second transistor T2 lowers the first output voltage OUTA from the second power supply voltage PGND, or the ground level. More specifically, the first output voltage OUTA is lowered from the ground level by a level corresponding to the voltage drop (hereafter referred to as diode drop) VF at the parasitic diode of the second transistor T2. This generates an undershoot A2 in the waveform of the first output voltage OUTA. In this state, the parasitic capacitor between the source and gate of the first transistor T1 also lowers the first drive voltage topA by a level corresponding to the diode drop VF. This generates an undershoot A1 in the waveform of the first drive voltage topA. Further, the current that flows from the motor 110 to the second output terminal 104 tends to flow to the first power supply VM through the parasitic diode of the third transistor T3. Accordingly, the second output voltage OUTB is raised from the first power supply VM by a level corresponding to the diode drop VF of the third transistor T3. Such switching noises A1, A2, and B1 are generated in the same manner when shifting from the second drive step to the switching step.

The occurrence of the switching noises A1, A2, and B1 is a phenomenon unique to motor control and H-bridge circuits. The power for recent LSIs has been lowered to an ultra-low level. Thus, when a plurality of functional blocks is mounted on the same chip like in a System On a Chip (SOC) the above switching noises may affect not only the operation of one functional block but also the operation of other functional blocks.

It would be advantageous to have an H-bridge drive circuit and an H-bridge driving method that reduce switching noise while preventing shoot-through currents from flowing through the H-bridge circuit.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
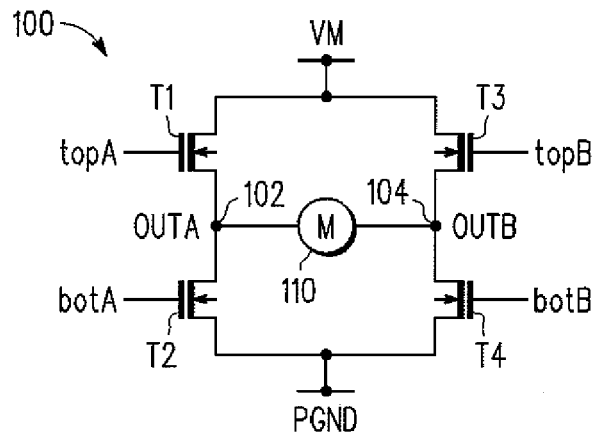
FIG. 1 is a schematic circuit diagram showing a prior art H-bridge circuit.

In the drawings, like numerals are used for like elements throughout.

The present invention provides an H-bridge drive circuit and an H-bridge driving method that reduce switching noise while preventing shoot-through currents from flowing through the H-bridge circuit.

One aspect of the present invention is an H-bridge drive circuit for driving a load with a first power supply and a second power supply that is lower in voltage than the first power supply. The H-bridge drive circuit includes first and second transistors connected in series between the first and second power supplies, with the first transistor being connectable to the first power supply and the second transistor being connectable to the second power supply. Third and fourth transistors are connected in series between the first and second power supplies, with the third transistor being connectable to the first power supply, the fourth transistor being connectable to the second power supply, and the load being connectable to a node between the first and the second transistors and a node between the third and the fourth transistors. A control circuit switches the activation and inactivation of the first to fourth transistors so that at least either one of the second and fourth transistors is substantially maintained in an activated state.

Another aspect of the present invention is an H-bridge drive circuit for driving a load with a first power supply and a second power supply that is lower in voltage than the first power supply. The H-bridge drive circuit includes first and second transistors connected in series between the first and the second power supplies, with the first transistor being connectable to the first power supply and the second transistor being connectable to the second power supply. Third and fourth transistors are connected in series between the first and the second power supplies, with the third transistor being connectable to the first power supply, the fourth transistor being connectable to the second power supply, and the load being connectable to a node between the first and second transistors and a node between the third and fourth transistors. A control circuit activates and inactivates a first set of the first and fourth transistors and a second set of the second and third transistors in a complementary manner. The control circuit inactivates the fourth transistor after inactivating the first transistor when activating the transistors of the first set, and inactivates the second transistor after inactivating the third transistor when inactivating the transistors of the second set.

A further aspect of the present invention is a method for controlling an H-bridge circuit for driving a load with a first power supply and a second power supply that is lower in voltage than the first power supply. The H-bridge circuit includes first and second transistors connected in series between the first and second power supplies, and third and fourth transistors connected in series between the first and the second power supplies. The method includes connecting the first transistor to the first power supply and the second transistor to the second power supply, connecting the third transistor to the first power supply and the fourth transistor to the second power supply, connecting the load to a node between the first and the second transistors and a node between the third and the fourth transistors, forming a first current path between the first and second power supplies by activating the first and fourth transistors and inactivating the second and third transistors, breaking the first current path by inactivating the first and fourth transistors, with the fourth transistor remaining activated until the first transistor is inactivated, forming a second current path between the first and second power supplies by activating the second and third transistors and inactivating the first and fourth transistors, and breaking the second current path by inactivating the second and third transistors, with the second transistor remaining activated until the third transistor is inactivated.

Other aspects and advantages of the present invention will become apparent from the following description, taken in conjunction with the accompanying drawings, illustrating by way of example the principles of the invention.

Figure 3:
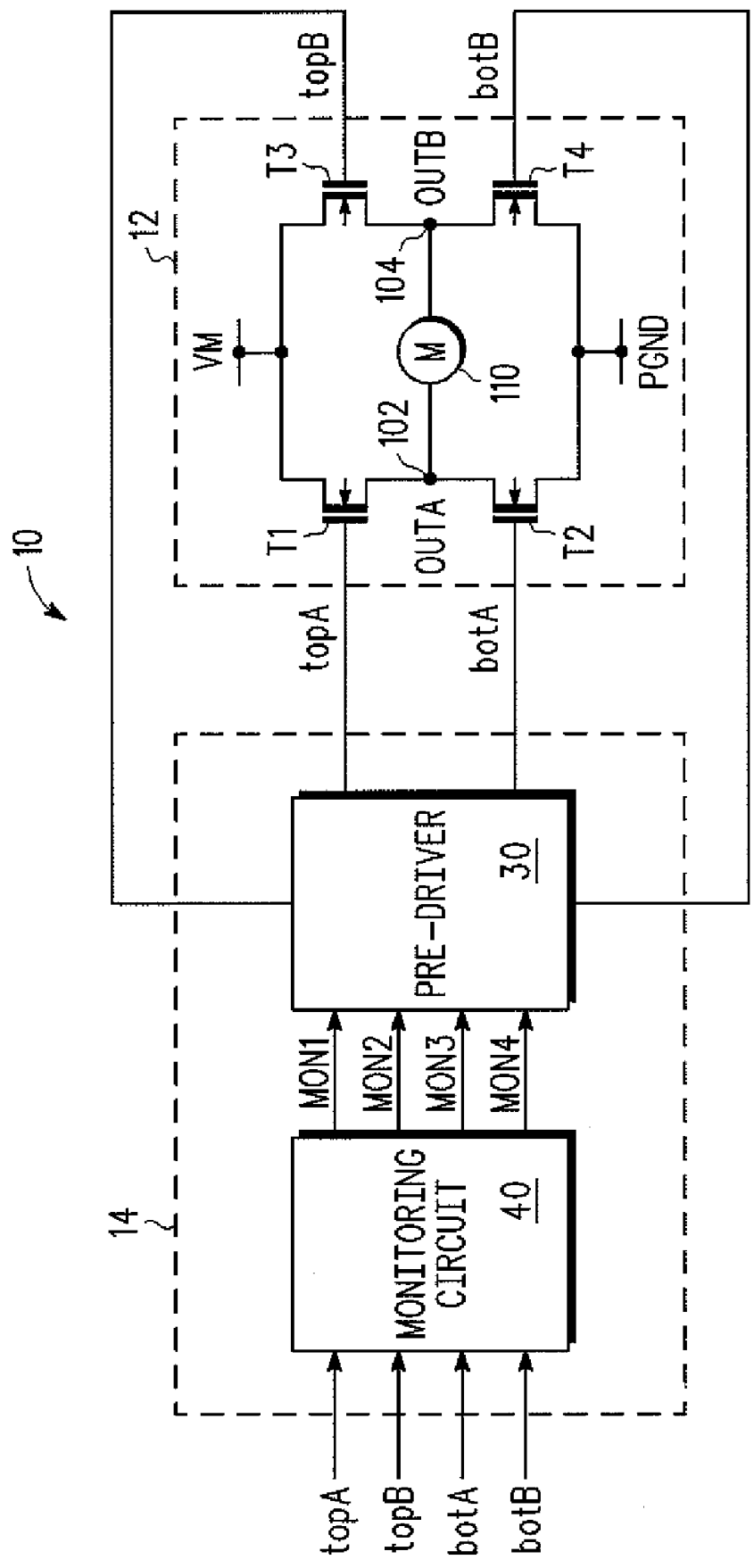
FIG. 3 is a schematic circuit diagram showing an H-bridge drive circuit according to an embodiment of the present invention.

An H-bridge drive circuit 10 according to a preferred embodiment of the present invention will now be discussed with reference to FIGS. 3 and 4. FIG. 3 is a schematic circuit block diagram of the H-bridge drive circuit 10.

As shown in FIG. 3, the H-bridge drive circuit 10 of the preferred embodiment includes an H-bridge circuit 12 and a control circuit 14. The H-bridge circuit 12 of FIG. 3 is identical to the H-bridge circuit 100 of FIG. 1. Thus, components that are the same as the corresponding components of FIG. 1 are given like or same reference numerals and will not be described in detail.

The control circuit 14 includes a monitoring circuit 40 and a pre-driver 30. The pre-driver 30 generates the first to fourth drive voltages topA, botA, topB, and botB for activating an inactivating the first to fourth transistors T1 to T4 of the H-bridge circuit 12. In the preferred embodiment, the transistors T1 to T4 are each formed by an N-channel MOS transistor, the first power supply VM is set to, for example, 5V, and the second power supply PGND is set to, for example, ground (0V).

The pre-driver 30 includes a sequential circuit (combinational logic), which is not shown in the drawings. The pre-driver 30 generates the drive voltages topA, botA, topB, and botB so that the first set of the first and fourth transistors T1 and T4 and the second set of the second and third transistors T2 and T3 are activated and inactivated in a complementary manner.

When the first and fourth transistors T1 and T4 are activated by the first and fourth drive voltages topA and botB having an H level, the second and third transistors T2 and T3 are inactivated by the second and third drive voltages botA and topB having an L level. In this state, a first current path is formed extending through the first and fourth transistors T1 and T4 between the first and the second power supplies VM and PGND. Accordingly, the first output voltage OUTA applied to the first output terminal 102 causes the motor 110 to generate rotation in the first direction (e.g., forward direction).

When the second and third transistors T2 and T3 are activated by the second and third drive voltages botA and topB having an H level, the first and fourth transistors T1 and T4 are inactivated by the first and fourth drive voltages topA and botB having an L level. In this state, a second current path is formed extending through the second and third transistors T2 and T3 between the first and the second power supplies VM, PGND. Accordingly, the second output voltage OUTB applied to the second output terminal 104 causes the motor 110 to generate rotation in the second direction (e.g., reverse direction), which differs from the first direction.

The monitoring circuit 40 detects the first to fourth drive voltages topA, botA, topB, and botB, which are supplied to the first to fourth transistors T1 to T4, and generates first to fourth detection signals MON1 to MON4. The monitoring circuit 40 is preferably formed by a plurality of comparators respectively detecting the gate voltages of the transistors T1 to T4. The first to fourth detection signals MON1 to MON4 generated by the monitoring circuit 40 are provided to the pre-driver 30. The pre-driver 30 of the preferred embodiment generates the first to fourth drive voltages topA, botA, topB, botB based on the first to fourth detection signals MON1 to MON4 from the monitoring circuit 40.

Figure 4:
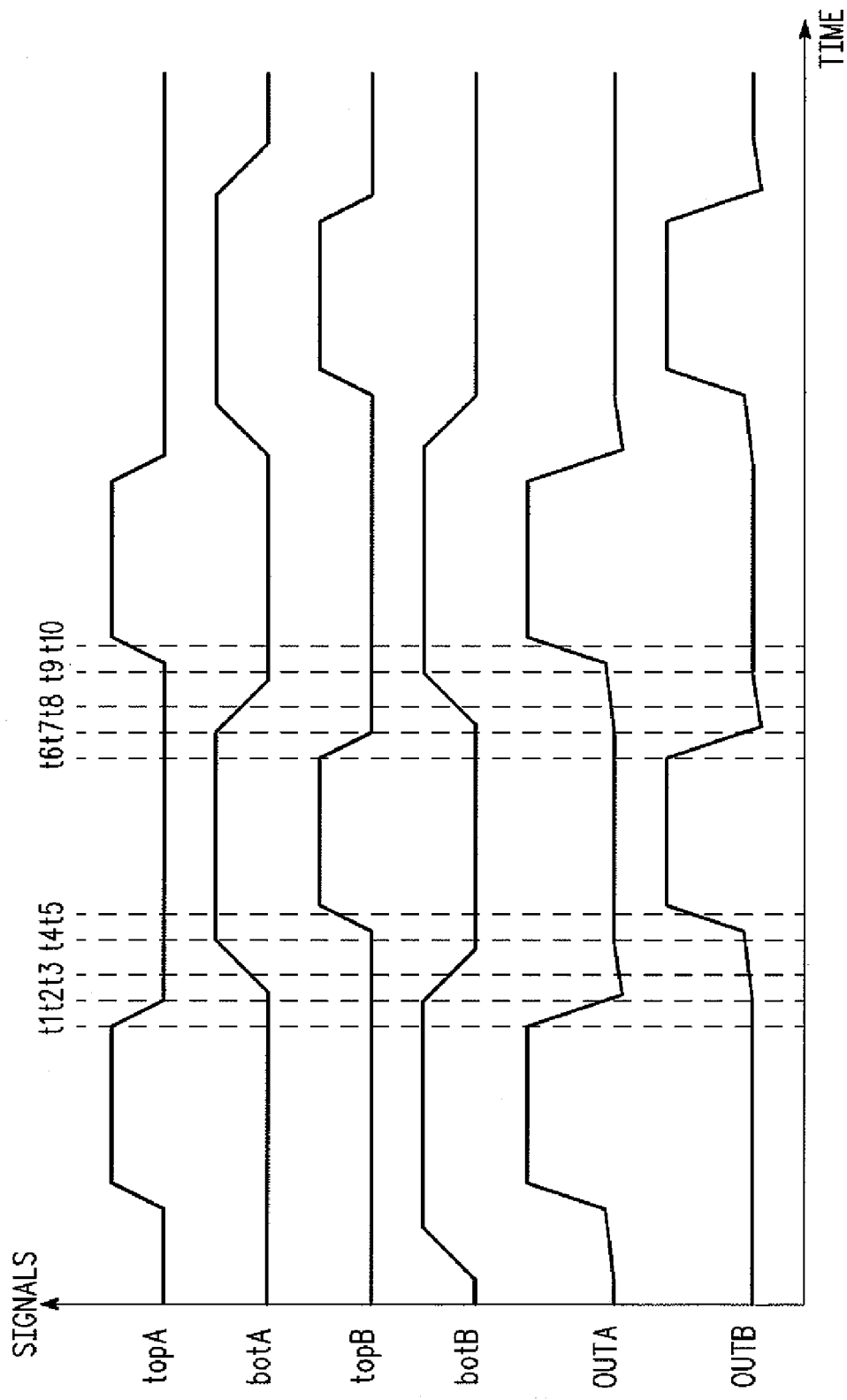
FIG. 4 is a timing diagram showing a drive sequence for controlling the H-bridge circuit of FIG. 3.

FIG. 4 is a timing diagram showing a drive sequence for controlling the H-bridge circuit 12 of FIG. 3. As shown in FIG. 4, the drive sequence of the preferred embodiment includes a first driving step for activating the first and fourth transistors T1 and T4 and forming the first current path, a second driving step for activating the second and third transistors T2 and T3 and forming the second current path, and a switching step for switching the activation and inactivation of the first to fourth transistors T1 to T4.

In the first driving step, the fourth transistor T4 is activated prior to the first transistor T1. That is, the control circuit 14 raises the fourth drive voltage botB to the H level before the first drive voltage topA. The first drive voltage topA starts to rise after the fourth drive voltage botB has risen to H level, and the rise in the first drive voltage topA raises the first output voltage OUTA.

At time t1, the control circuit 14 lowers the first drive voltage topA and inactivates the first transistor T1. The first output voltage OUTA decreases as the first drive voltage topA decreases.

At time t2, the first drive voltage topA reaches the L level (0V or OUTA level) The monitoring circuit 40 of the control circuit 14 detects the first drive voltage topA having the L level and provides the pre-driver 30 with the first detection signal MON1 indicating the detection result. In response to the first detection signal MON1 from the monitoring circuit 40, the pre-driver 30 lowers the fourth drive voltage botB to inactivate the fourth transistor T4. Thus, the fourth transistor T4 is inactivated after the first transistor T1 is inactivated. Accordingly, the fourth transistor T4 remains activated for a certain period of time even after the first transistor T1 is inactivated.

The fourth transistor T4 remains activated until the fourth drive voltage botB becomes lower than the threshold value of the fourth transistor T4. In the preferred embodiment, at time t3 shown in FIG. 4, the fourth drive voltage botB has a level that is slightly higher than the threshold value of the fourth transistor T4 (e.g., level between the H level and L level of the fourth drive voltage botB) Therefore, the fourth transistor T4 is still activated at time t3.

The monitoring circuit 40 of the control circuit 14 detects the fourth drive voltage botB supplied to the gate of the fourth transistor T4 and provides the pre-driver 30 with the fourth detection signal MON4 indicating the detection result. The pre-driver 30 starts to raise the second drive voltage botA slightly before time t3 in response to the fourth detection signal MON4 from the monitoring circuit 40. The pre-driver 30 then activates the second transistor T2 with the second drive voltage botA at substantially the same time as when the fourth drive voltage botB inactivates the fourth transistor T4. That is, the control circuit 14 raises the second drive voltage botA so that the switching of the fourth transistor T4 from an activated state to an inactivated state and the switching of the second transistor T2 from an inactivated state to an activated state are overlapped and performed in a substantially continuous manner.

Then, at time t4, the second drive voltage botA reaches the H level. As shown in FIG. 4, the fourth drive voltage botB reaches the L level slightly before or substantially at time t4. The monitoring circuit 40 of the control circuit 14 separately detects the second drive voltage botA having an H level and the fourth drive voltage botB having an L level. Then, the monitoring circuit 40 provides the pre-driver 30 with the second detection signal MON2 and the fourth detection signal MON4 that indicate the detection result. The pre-driver 30 starts to raise the third drive voltage topB in response to the second and fourth detection signals MON2 and MON4 from the monitoring circuit 40. The rise in the third drive voltage topB raises the second output voltage OUTB. As a result, the motor 110 is driven in the second driving step.

The switching from the first driving step to the second driving step has been described above. The switching from the second driving step to the first driving step is performed in the same manner. That is, the control circuit 14 performs the switching step between time t6 to t10 shown in FIG. 4 in the same manner as the switching step performed between time t1 to t5. Specifically, at time t7, the control circuit 14 lowers the second drive voltage botA as the third drive voltage topB reaches the L level. Between time t7 to time t9, the control circuit 14 controls the switching of the second transistor T2 from an activated state to an inactivated state and the switching of the fourth transistor T4 from an inactivated state to an activated state in an overlapped and substantially continuous manner. The control circuit 14 then raises the first drive voltage topA when the second drive voltage botA reaches the L level and the fourth drive voltage botB reaches the H level.

Figure 2:
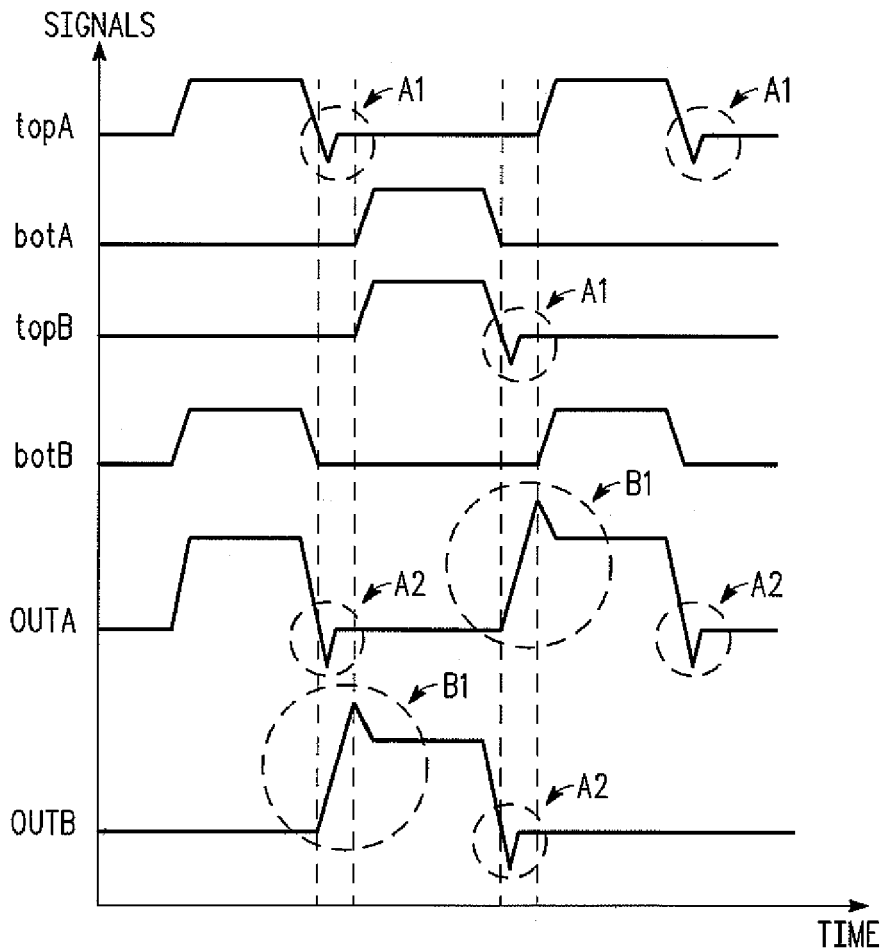
FIG. 2 is a timing diagram showing a drive sequence for controlling the H-bridge circuit of FIG. 1.

The H-bridge drive circuit 10 of the preferred embodiment has the advantages described below. When switching from the first driving step to the second driving step, the control circuit 14 monitors the gate voltage of the first transistor T1 and inactivates the fourth transistor T4 after inactivating the first transistor T1. As a result, the second output voltage OUTB is clamped at the ground potential for a certain period of time after the first transistor T1 is inactivated. Further, since the second drive voltage botA activates the second transistor T2, the first output voltage OUTA is also clamped at the ground potential. This prevents the generation of noise caused by a back electromotive force (BEMF). Consequently, switching noises, such as the undershoots A1 and A2 and the overshoot B1 shown in FIG. 2, are greatly reduced. In the same manner, when switching from the second driving step to the first driving step, the first and second output voltages OUTA and OUTB are clamped at the ground potential for a certain period of time. Accordingly, the generation of noise caused by BEMF is prevented.

In the switching step between the first and the second driving steps, the control circuit 14 switches the activation and inactivation of the second transistor T2 and the activation and inactivation of the fourth transistor T4 in an overlapped and substantially continuous manner. Consequently, switching noises, such as the undershoots A1 and A2 and the overshoot B1 shown in FIG. 2, are further reduced.

When switching from the first driving step to the second driving step, the control circuit 14 activates the third transistor T3 when the fourth transistor T4 is inactivated. Accordingly, the third and fourth transistors T3 and T4 are not simultaneously activated. This prevents shoot-through current from flowing between the first and the second power supplies VM and PGND. In the same manner, when switching from the second driving step to the first driving step, the control circuit 14 activates the first transistor T1 when the second transistor T2 is inactivated. This prevents shoot-through current from flowing through the first and second transistors T1 and T2.

It should be apparent to those skilled in the art that the present invention may be embodied in many other specific forms without departing from the spirit or scope of the invention. Particularly, it should be understood that the present invention may be embodied in the following forms.

The transistors T1 to T4 of the H-bridge circuit 12 may each be formed by a P-channel MOS transistor or a complementary transistor, which is a combination of P-channel and N-channel transistors.

The application of the H-bridge drive circuit of the present invention is not limited to a motor driver for driving the motor 110. For example, the H-bridge drive circuit may be applied to a step-up/step-down switching regulator for supplying power to an internal circuit (load) of an LSI.

The present examples and embodiments are to be considered as illustrative and not restrictive, and the invention is not to be limited to the details given herein, but may be modified within the scope and equivalence of the appended claims.

What is claimed is:

1. An H-bridge drive circuit for driving a load with a first power supply and a second power supply that is lower in voltage than the first power supply, the H-bridge drive circuit comprising:

first and second transistors connected in series between the first and second power supplies, with the first transistor being connected to the first power supply and the second transistor being connected to the second power supply;

third and fourth transistors connected in series between the first and second power supplies, with the third transistor being connectable to the first power supply, the fourth transistor being connectable to the second power supply, and the load being connectable to a node between the first and the second transistors and a node between the third and the fourth transistors; and a control circuit for switching the activation and inactivation of the first to fourth transistors in accordance with the following sequence, activating the fourth transistor and then activating the first transistor, inactivating the first transistor, when the gate of the first transistor has a low voltage, inactivating the fourth transistor, activating the second transistor before the gate of the fourth transistor has a low voltage, and activating the third transistor when the gate of the second transistor has a high voltage and the gate of the fourth transistor has a low voltage, thereby causing an output voltage at the node between the third and fourth transistors to drive the load.

2. The H-bridge drive circuit according to claim 1, wherein the fourth transistor is activated for a longer time than the first transistor, and the second transistor is activated for a longer time than the third transistor.

3. The H-bridge drive circuit according to claim 1, wherein the control circuit includes:

a pre-driver for generating first to fourth drive voltages for respectively driving the first to fourth transistors; and a monitoring circuit, connected to the pre-driver and the first to fourth transistors, for detecting the first to fourth drive voltages supplied to the first to fourth transistors and generating first to fourth detection signals;

wherein the pre-driver generates the first to fourth drive voltages based on the first to fourth detection signals.

4. The H-bridge circuit according to claim 1, wherein the control circuit switches the activation and inactivation of the second transistor and the activation and inactivation of the fourth transistor in an overlapped and substantially continuous manner.

5. A method for controlling an H-bridge circuit for driving a load with a first power supply and a second power supply that is lower in voltage than the first power supply, the H-bridge circuit including first and second transistors connected in series between the first and second power supplies, and third and fourth transistors connected in series between the first and the second power supplies, the method comprising:

activating the fourth transistor and then activating the first transistor;

inactivating the first transistor;

when the gate of the first transistor has a low voltage, inactivating the fourth transistor;

activating the second transistor before the gate of the fourth transistor has a low voltage; and activating the third transistor when the gate of the second transistor has a high voltage and the gate of the fourth transistor has a low voltage, thereby causing an output voltage at the node between the third and fourth transistors to drive the load.

* * * * *